US009741691B2

(12) United States Patent
Lim et al.

(10) Patent No.: US 9,741,691 B2
(45) Date of Patent: Aug. 22, 2017

(54) POWER DELIVERY NETWORK (PDN) DESIGN FOR MONOLITHIC THREE-DIMENSIONAL (3-D) INTEGRATED CIRCUIT (IC)

(71) Applicant: QUALCOMM Incorporated, San Diego, CA (US)

(72) Inventors: Sung Kyu Lim, Duluth, GA (US); Kambiz Samadi, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 7 days.

(21) Appl. No.: 14/698,842

(22) Filed: Apr. 29, 2015

(65) Prior Publication Data

US 2016/0322331 A1 Nov. 3, 2016

(51) Int. Cl.
*H01L 23/48* (2006.01)
*H01L 25/065* (2006.01)
*H01L 23/528* (2006.01)
*H01L 27/06* (2006.01)
(Continued)

(52) U.S. Cl.
CPC ........ *H01L 25/0657* (2013.01); *H01L 23/481* (2013.01); *H01L 23/5286* (2013.01); *H01L 24/05* (2013.01); *H01L 24/11* (2013.01); *H01L 24/14* (2013.01); *H01L 25/50* (2013.01); *H01L 27/0688* (2013.01); *H01L 2224/05147* (2013.01); *H01L 2224/131* (2013.01); *H01L 2224/32145* (2013.01);
(Continued)

(58) Field of Classification Search
CPC ... H01L 23/481; H01L 23/5286; H01L 24/05; H01L 24/11; H01L 24/14; H01L 25/0657; H01L 25/50

USPC ....... 257/207, 208, 211, 686, 691, 692, 694, 257/737, 777
See application file for complete search history.

(56) References Cited

U.S. PATENT DOCUMENTS 7,446,420 B1 * 11/2008 Kim ................. H01L 23/50
257/723
8,035,194 B2 10/2011 Lee et al.
8,276,002 B2 9/2012 Dennard et al.
(Continued)

FOREIGN PATENT DOCUMENTS

KR 20140085742 A 7/2014

OTHER PUBLICATIONS

Billoint O., et al., "A Comprehensive Study of Monolithic 3D Cell on Cell Design using Commercial 2D Tool", 2015 Design, Automation & Test in Europe Conference & Exhibition (Date), EDAA, Mar. 9, 2015 (Mar. 9, 2015), pp. 1192-1196, XP032765837, [retrieved on Apr. 22, 2015] Sections III.B. and IV.C, figure 3.
(Continued)

*Primary Examiner* — Hung Vu
(74) *Attorney, Agent, or Firm* — Muncy, Geissler, Olds & Lowe, P.C./QUALCOMM (57) ABSTRACT

Systems and methods relate to power delivery networks (PDNs) for monolithic three-dimensional integrated circuits (3D-ICs). A monolithic 3D-IC includes a first die adjacent to and in contact with power/ground bumps. A second die is stacked on the first die, the second die separated from the power/ground bumps by the first die. One or more bypass power/ground vias and one or more monolithic inter-tier vias (MIVs) are configured to deliver power from the power/ground bumps to the second die.

6 Claims, 5 Drawing Sheets (51) Int. Cl.
  *H01L 23/00* (2006.01)
  *H01L 25/00* (2006.01)
(52) U.S. Cl.
  CPC .............. *H01L 2224/73153* (2013.01); *H01L 2225/06541* (2013.01); *H01L 2924/10253* (2013.01)

(56) References Cited

U.S. PATENT DOCUMENTS

| | | |
|---|---|---|
| 8,344,512 B2 | 1/2013 | Knickerbocker |
| 8,445,918 B2 | 5/2013 | Bartley et al. |
| 8,450,804 B2* | 5/2013 | Sekar ................ H01L 23/3677 257/347 |
| 8,674,470 B1 | 3/2014 | Or-Bach et al. |
| 2012/0025388 A1* | 2/2012 | Law ..................... H01L 24/16 257/773 |
| 2014/0264862 A1 | 9/2014 | Tsai et al. |
| 2015/0059362 A1* | 3/2015 | Chou ..................... F25B 21/02 62/3.7 |

OTHER PUBLICATIONS

International Search Report and Written Opinion—PCT/US2016/027406—ISA/EPO—Jun. 30, 2016.
Panth S., et al., "High-Density Integration of Functional Modules Using Monolithic 3D-IC Technology," 2013 18th Asia and South Pacific Design Automation Conference (ASP-DAC), IEEE, 8C-1, Jan. 22-25, 2013, pp. 681-686.

* cited by examiner

POWER DELIVERY NETWORK (PDN) DESIGN FOR MONOLITHIC THREE-DIMENSIONAL (3-D) INTEGRATED CIRCUIT (IC)

FIELD OF DISCLOSURE

Disclosed aspects relate to power delivery networks (PDNs) for monolithic three-dimensional integrated circuits (3D-ICs). More specifically, exemplary aspects relate to utilizing bypass power/ground (P/G) via arrays and P/G monolithic inter-tier via (MIV) arrays in monolithic 3D-ICs to support vertical power delivery.

BACKGROUND

Three-dimensional integrated circuits (3D-ICs) have emerged as a promising solution to extend the 2D scaling trajectory predicted by the Moore's Law. Currently, through-silicon vias (TSVs) are used in the formation of 3D-ICs to allow vertical stacking of multiple dies fabricated separately. However, the quality of TSV-based 3D-ICs strongly depends on dimensions of TSVs and parasitic elements, and are limited to memory-on-logic or large logic-on-logic designs with relatively small number of global interconnects.

An emerging alternative to TSV-based 3D-ICs is monolithic 3D-ICs (also known as "M3D"). Monolithic 3D-IC technology involves sequential fabrication of two or more tiers of devices, instead of bonding two previously fabricated dies using micro bumps.

Monolithic 3D-ICs enable integration densities which are orders of magnitude higher than that of (TSV)-based 3D-IC technology. This is due to the fact that monolithic 3D-ICs utilize extremely small monolithic inter-tier vias (MIVs). Overall, MIVs provide better electrical characteristics (i.e., less parasitics, electrical coupling, etc.) than TSVs, and also enable higher integration densities due to their small size.

However, monolithic 3D-ICs face challenges when it comes to power delivery. The packed integration of tiers of devices in monolithic 3D-ICs leaves very little room for integration of power delivery networks (PDNs). Accordingly, effective solutions for integration of PDNs in monolithic 3D-ICs are needed.

SUMMARY

Exemplary aspects include systems and methods for power delivery related to monolithic three-dimensional integrated circuits (3D-ICs). A monolithic 3D-IC includes a first die directly coupled to power/ground bumps. A second die is stacked on the first die, the second die separated from the power/ground bumps by the first die. One or more bypass power/ground vias and one or more monolithic inter-tier vias (MIVs) are configured to deliver power from the power/ground bumps to the second die.

For example, an exemplary aspect relates to an apparatus for delivering power in a monolithic three-dimensional integrated circuit (3D-IC), comprising: a first die adjacent to and in contact with power/ground bumps. A second die is stacked on the first die, the second die separated from the power/ground bumps by the first die, and one or more bypass power/ground vias are configured to deliver power from the power/ground bumps to the second die.

Another exemplary aspect relates to a method for delivering power in a monolithic three-dimensional integrated circuit (3D-IC), the method comprising: forming power/ground bumps adjacent to and in contact with a first die, stacking a second die on the first die, the second die separated from the power/ground bumps by the first die, and delivering power from the power/ground bumps to the second die using one or more bypass power/ground vias.

Yet another exemplary aspect relates to a system comprising: a monolithic three-dimensional integrated circuit (3D-IC), means for delivering power in contact with and adjacent to a first die of the monolithic 3D-IC, a second die of the monolithic 3D-IC stacked on the first die, the second die separated from the means for delivering power by the first die, and means for bypassing dies, to deliver power from the means for delivering power to the second die.

BRIEF DESCRIPTION OF THE DRAWINGS

The accompanying drawings are presented to aid in the description of the technology described herein and are provided solely for illustration of the implementations and not for limitation of the implementations.

DETAILED DESCRIPTION

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In general, exemplary aspects of this disclosure are directed to efficient low-cost power delivery network (PDN) designs for monolithic 3D-ICs. Exemplary monolithic 3D-ICs discussed herein include the integration or fabrication of two or more stacked dies. Without loss of generality, at least one of the dies is referred to as a first die or a top die and another die is referred to as a second die or a bottom die, keeping in mind that terms like "top" and "bottom" are merely used to convey relative orientations of the dies with respect to one another and do not imply absolute directions. For example, as discussed herein, the first die or the top die is adjacent to and in contact with means for delivering power, such as solder bumps for power/ground connections or power/ground bumps. On the other hand, the second die or the bottom die, which is stacked on the first/top die is not adjacent to the power/ground bumps, but is separated from the power/ground bumps by the first/top die.

A PDN in a monolithic 3D-IC can be monitored to measure an actual voltage level. If an ideal voltage level is 1.0V, because of the long power wires in the PDN, the PDN may have a voltage drop and signal loss. For example, if a voltage level at the PDN in the first/top die is 1.0V the voltage level in the second/bottom die may only be 0.98V or 0.95V, for example. Such deviations from the ideal voltage level may cause delay degradation of transistors and reduction in noise margins of the circuitry.

In exemplary aspects, in order to combat deviations from the ideal voltage level in the second die, means for bypassing dies, such as bypass power/ground (P/G) vias are introduced. The first die is directly supplied power from the power/ground bumps since the first die is adjacent to and in contact with the power/ground bumps. However, the second die is not in contact with the power/ground bumps, but is separated from the power/ground bumps by at least the first die. Since the second die is separated from the power/ground bumps by at least the first die, the bypass power/ground (P/G) vias are added to the PDN in a monolithic 3D-IC so that power is delivered to the second die from the power/ground bumps through the bypass P/G vias. The bypass power/ground vias include at least a first bypass power/ground via formed in the first die and at least a second power/ground via formed in the second die in some examples. Furthermore, in some examples, interconnecting the first and second power/ground vias may be accomplished by several means such as one or more copper pads, one or more vertical monolithic inter-tier vias (MIVs), etc. Power is not supplied to the first die through the bypass power/ground vias but delivered to the second die through the first and second bypass power/ground vias (which may be coupled or interconnected by the vertical MIVs, for example). Adding the bypass P/G vias in this manner may reduce the voltage drop at the second die.

Figure 1:
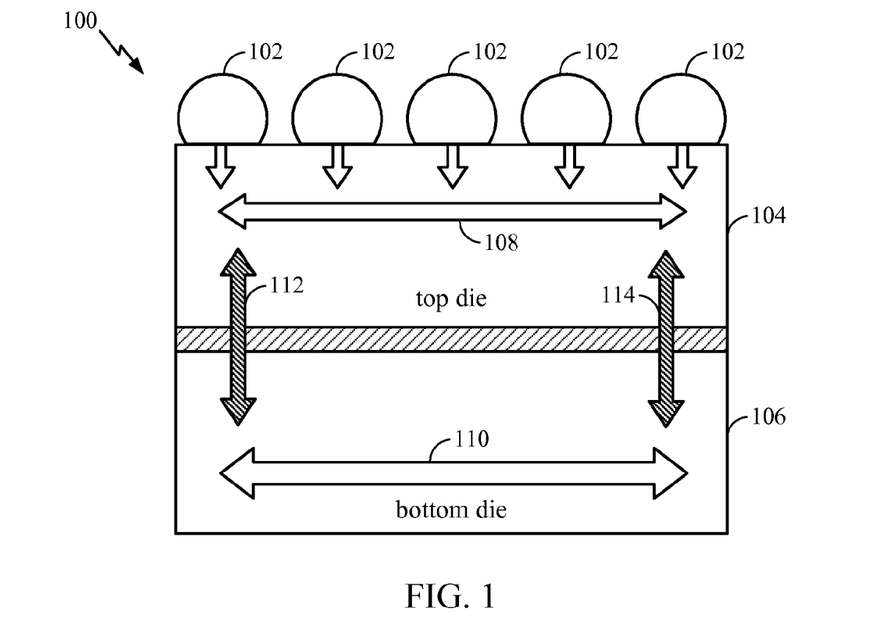
FIG. 1 is a cross-sectional view of a power delivery network (PDN) design for a monolithic 3D-IC 100 according to one or more aspects, wherein power/ground (P/G) vertical monolithic inter-tier vias (MIVs) are confined to the periphery of the monolithic 3D-IC 100.

FIG. 1 is a cross-sectional view of a PDN design for a monolithic 3D-IC 100 according to one or more aspects described herein. The illustrated monolithic 3D-IC 100 includes several power/ground bumps 102 directly coupled to or in contact with the first die 104. The first die 104 is stacked on a second die 106. For purposes of illustration, assume that a nominal voltage level is 1.0V. Because of the long power wires in the PDN, the PDN may have a voltage drop and signal loss. Particularly, the first die 104 may not suffer from a voltage drop as great as the voltage drop in the second die 106, because the first die 104 is closer to the power/ground bumps. On the other hand, if the ideal voltage is 1.0V, for example, due to the voltage drop caused by long lines of the PDN, the voltages in the second die 106 may be 0.98V, 0.95V, etc., in some parts.

Arrows 108 and 110 are intended to indicate lateral power delivery distribution using metal layers. Thicker arrows indicate more metal lines. More metal lines are used in order to reduce IR-drop noise, where I is current and R is resistance of the metal lines. Arrow 108 is shown to be narrower than the arrow 110. This is intended to indicate that more metal lines are employed in the second die 106 than in the first die 104. This is to combat the greater voltage drop in the second die 106 in comparison to the voltage drop in the first die 104. As noted above, the second die faces greater voltage drop because the power/ground bumps 102 are closer to the first die 104 than to the second die 106.

Vertical monolithic inter-tier vias (MIVs) 112 and 114 are also depicted with correspondingly labeled arrows. The vertical MIVs 112 and 114 deliver current/power to functional modules in the first die 104 and the second die 106. Note that the vertical MIVs 112 and 114 are only located on the periphery of the illustrated monolithic 3D-IC 100.

It is to be noted that using the vertical MIVs as opposed to TSVs reduces the amount of space that the vias occupy. This is because conventional TSVs are large, e.g., the scale of microns, whereas MIVs smaller, in the scale of nanometers, for example.

Figure 2:
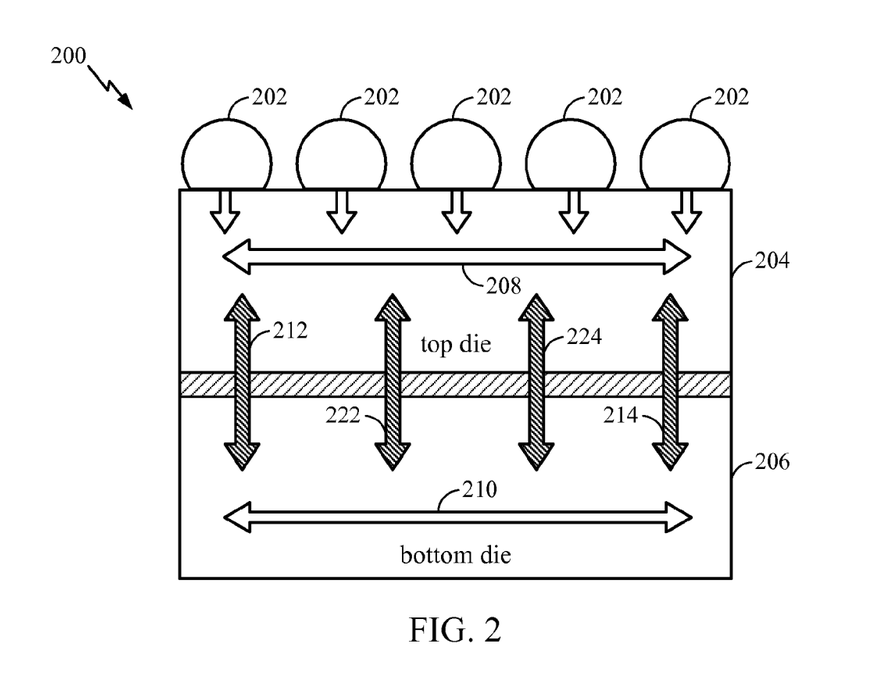
FIG. 2 is a cross-sectional view of a PDN design for a monolithic 3D-IC 200 according to one or more aspects wherein P/G vertical MIVs spread out throughout the 3D-IC 200 including the middle as well as the periphery.

FIG. 2 is a cross-sectional view of a PDN design for a monolithic 3D-IC 200 according to one or more aspects described herein. The monolithic 3D-IC 200 includes several power/ground bumps 202 directly coupled to or in contact with a first die 204 which is stacked on a second die 206. The illustrated PDN design for the monolithic 3D-IC 200 includes the arrow 208 and vertical MIVs 212 and 214, which are similar to the arrow 108 and the vertical MIVs 112 and 114 described with relation to the monolithic 3D-IC 100.

The PDN design for the monolithic 3D-IC 200 is also shown to include additional vertical MIVs such as 222 and 224, which are not confined to the periphery.

The PDN design for the monolithic 3D-IC 200 also includes later power delivery distribution in the second die 206, indicated by arrow 210. In comparison to the arrow 110 discussed with regard to the monolithic 3D-IC 100, it is seen that the arrow 210 is much narrower than the arrow 110. This is because adding the vertical MIVs 222 and 224 reduces the amount of lateral power wires that are needed in the second die 206.

It is also to be noted that adding the vertical MIVs 222 and 224 throughout the monolithic 3D-IC 200, including in the middle (i.e., not limited to the periphery) of the illustrated monolithic 3D-IC 200 may not increase the amount of space occupied by of the vertical MIVs in comparison to TSV-based 3D-ICs, for example (since TSVs are much larger than MIVs, as noted previously).

Figure 3:
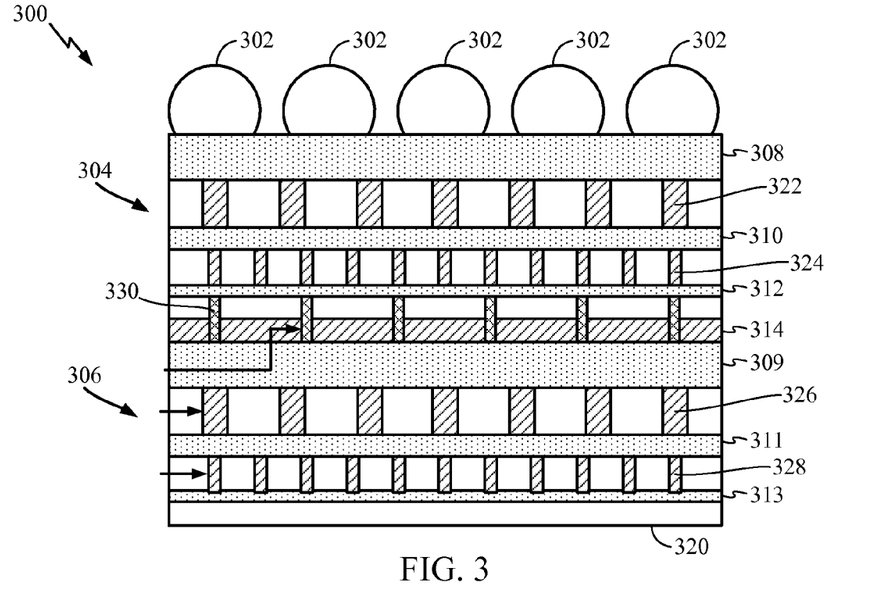
FIG. 3 is a cross-sectional view of a PDN design for a monolithic 3D-IC 300 according to one or more aspects, wherein the 3D-IC 300 is integrated in a face-to-back configuration of a first die and a second die and the second die does not include bypass P/G MIVs.

FIG. 3 is a cross-sectional view of a PDN design for a monolithic 3D-IC 300 according to one or more aspects described herein. The illustrated monolithic 3D-IC 300 includes several solder bumps or power/ground bumps 302 formed adjacent to and in contact with a first die 304, and a second die 306 stacked on the first die 304 in a face-to-back configuration, with the face of the second die 306 stacked on the back of the first die 304. The second die 306 is separated from the power/ground bumps 302 by the first die 304. The face of the first die 304 is a metal side of the first die 304 and the back of the first die 304 is a bulk silicon side of the first die 304. The face of the second die 306 is a metal side of the second die 306 and the back of the second die 306 is a bulk silicon side of the die second 306.

The first die 304 includes a global PDN layer 308 on the face of the first die 304. The first die 304 also includes a medium PDN layer 310 and a local PDN layer 312. The first die 304 further includes an interlayer dielectric 314 on a back side of the first die 304. The second die 306 includes another global PDN layer 309 on the face of the second die 306, another medium PDN layer 311, another local PDN layer 313, and a bulk silicon layer 320 on the back side of the second die 306.

With regard to the first die 304, one or more power/ground (P/G) vias 322 are located between the global PDN layer 308 and the medium PDN layer 310 in the first die 304. Similarly, one or more power/ground vias 324 are also located between the medium PDN layer 310 and the local PDN layer 312 in the first die 304.

With regard to the second die 306, one or more power/ground vias 326 are located between the global PDN layer 309 and the medium PDN layer 311 in the second die 306 and one or more power/ground vias 328 are located between the medium PDN layer 311 and the local PDN layer 313 in the second die 306.

Several (e.g., hundreds, thousands, etc.) vertical MIVs 330 are disposed in interlayer dielectric 314 of the first die 304. The illustrated MIVs 330 are also located between the local PDN layer 312 in the first die 304 and the global PDN layer 309 in the second die 306. In the face-to-back configuration of monolithic 3D-IC 300, the MIVs 330 couple the back of the first die 304 to the face of the second die 306. Using the vertical MIVs 330 as opposed to TSVs reduces the amount of space that the vias occupy, as previously discussed.

Also in this configuration, power is delivered to both the first die 304 and the second die 306 from the solder bumps 302, through the global PDN layer 308 in the first die 304, the power/ground vias 322 in the first die 306, the medium PDN layer 310 in the first die 304, the power/ground vias 324 in the first die 304, the local PDN layer 312 in the first die 304, the MIVs 330, the interlayer dielectric 314 of the first die 304, the global PDN layer 309 in the second die 306, the power/ground vias 326 in the second die 306, the medium PDN layer 311 in the second die 306, and the local PDN layer 313 in the second die 306.

With this face-to-back configuration, although it works well because power is delivered from the power/ground bumps 302, to the first die 304, and to the second die 306, there will be a voltage drop in the second die 306 at the global PDN layer 309 in the second die 306, the medium PDN layer 311 in the second die 306, and the local PDN layer 313 in the second die 306. As a result, the performance of any components in the second die 306 may suffer from lack of ideal voltage and/or current.

Figure 4:
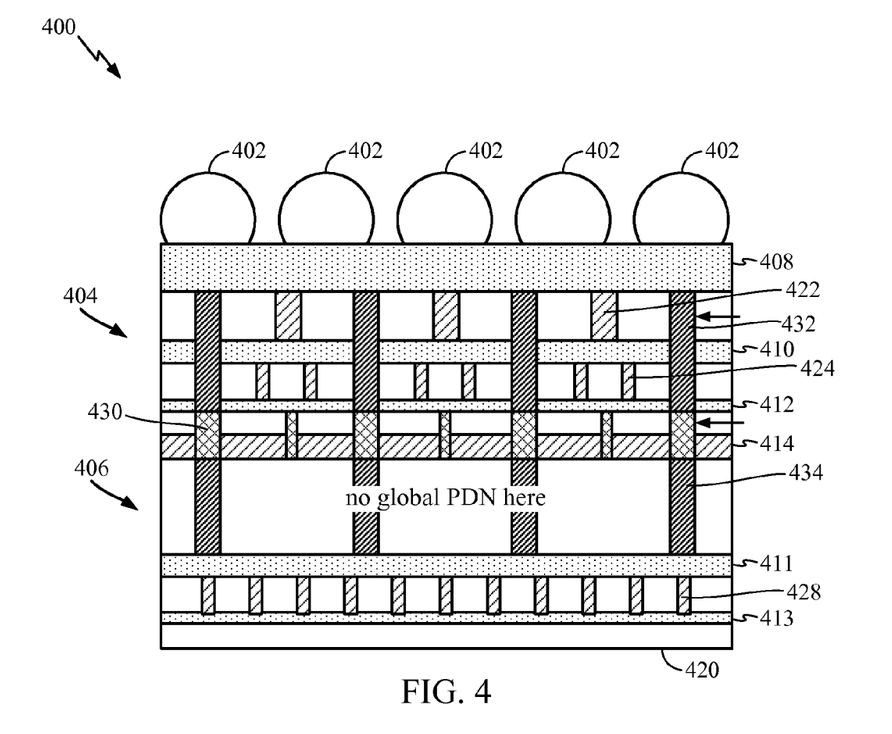
FIG. 4 is a cross-sectional view of a PDN design for a monolithic 3D-IC according to one or more according to one or more aspects, wherein the 3D-IC 400 is integrated in a face-to-back configuration of a first die and a second die, and the second die includes bypass P/G MIVs.

FIG. 4 is a cross-sectional view of a PDN design for a monolithic 3D-IC 400 according to one or more aspects described herein. The illustrated monolithic 3D-IC 400 includes several power/ground bumps 402 formed adjacent to and in contact with a first die 404, and a second die 406 stacked on the first die 404, also in a face-to-back configuration, with the face of the second die 406 stacked on the back of the first die 404. The second die 406 is separated from the power/ground bumps 402 by the first die 404. The face of the first die 404 is a metal side of the first die 404 and the back of the first die 404 is a bulk silicon side of the first die 404. The face of the second die 406 is a metal side of the second die 406 and the back of the second die 406 is a bulk silicon side of the second die 406.

The first die 404 includes a global PDN layer 408 on the face of the first die 404 which is in contact with the power/ground bumps 402, a medium PDN layer 410, and a local PDN layer 412. The first die 404 also includes an interlayer dielectric 414 on the back of the first die 404.

One or more power/ground vias 422 are located between the global PDN layer 408 and the medium PDN layer 410 in the first die 404. One or more power/ground vias 424 are located between the medium PDN layer 410 and the local PDN layer 412 in the first die 404.

Several vertical MIVs 430 are disposed in the interlayer dielectric 414 of the first die 404. In this face-to-back configuration, the vertical MIVs 430 couple the back of the first die 404 to the face of the second die 406. Once again, using the vertical MIVs 430 as opposed to TSVs reduces the amount of space that the vias occupy.

The second die 406 includes another medium PDN layer 411, another local PDN layer 413, and a bulk silicon layer 420. The second die 406 also includes one or more power/ground vias 428 located between the medium PDN layer 411 and the local PDN layer 413.

The monolithic 3D-IC 400 differs from the monolithic 3D-IC 300 in that the second die 406 does not have another global PDN layer, such as the global PDN layer 309 of the monolithic 3D-IC 300. Correspondingly, the second die 406 does not have power/ground vias that would couple such a global PDN layer to the medium PDN layer 411 in the second die 406 either.

The monolithic 3D-IC 400 also differs from the monolithic 3D-IC 300 in that the first die 404 includes one or more bypass power/ground vias 432 (also referred to as the first bypass power/ground vias) in the first die 404 and one or more bypass power/ground vias 434 (also referred to as the second bypass power/ground vias) in the second die 406. The vertical MIVs 430 couple the bypass power/ground vias 432 and the bypass power/ground vias 434 to each other. In one implementation, one or more power/ground vias 432 in the first die 404 and one or more bypass power/ground vias 434 in the second die 406 may be coupled together by one or more interconnects which can include copper pads, vertical MIVs 430, etc. In one example, the bypass power/ground vias 434 and the power/ground vias 432 in the first die 404 may be arranged in arrays (e.g., arrays of 5×5, 10×10, 50×50, etc.) and coupled by corresponding arrays of vertical MIVs 430.

Thus, in the monolithic 3D-IC 400, the bypass power/ground vias 432 and the bypass power/ground vias 434 allow power to be delivered to the second die 406 from the power/ground bumps 402, through the global PDN layer 408 in the first die 404, bypass the power/ground vias 422 in the first die 406, bypass the medium PDN layer 410 in the first die 404, bypass the power/ground vias 424 in the first die 404, bypass the local PDN layer 412 in the first die 404, and bypass the interlayer dielectric 414 of the first die 404. It is noted that power is delivered directly to the first die 404 from the power/ground bumps 402 based on contact, and the bypass power/ground vias 432 and 434 (coupled by the vertical MIVs 430) deliver power to the second die 406 but not to the first die 404.

Thus, at least the bypass power/ground vias 432 and 434 couple global PDN layer 408 in contact with the power/ground bumps 402 to the medium PDN layer 411 in the second die 406. It is noted that, not having a global PDN layer and related power/ground vias in the second die 406 allows space for more components to be fabricated in the monolithic 3D-IC 400.

With the face-to-back configuration shown in FIG. 4, because power is delivered from the power/ground bumps 402 to the second die 406 through the bypass power/ground vias 432 and 434 (coupled by the vertical MIVs 430), voltage drop and/or voltage droop in the second die 406 may be reduced. As a result, the performance of any components in the second die 406 may not suffer from lack of expected/ideal voltage and/or current.

Figure 5:
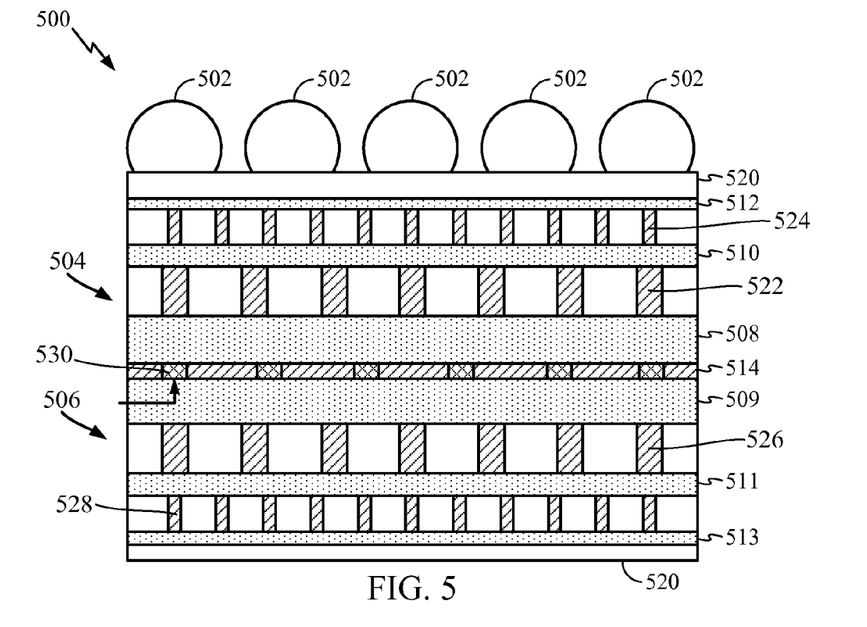
FIG. 5 is a cross-sectional view of a PDN design for a monolithic 3D-IC according to one or more according to one or more aspects, wherein the 3D-IC 500 is integrated in a face-to-face configuration of a first die and a second die, and the second die does not include bypass P/G MIVs.

FIG. 5 is a cross-sectional view of a PDN design for a monolithic 3D-IC 500 according to one or more aspects described herein. The illustrated monolithic 3D-IC 500 includes several solder bumps or power/ground bumps 502 formed adjacent to and in contact with a first die 504, and a second die 506 stacked on the first die 504 in a face-to-face configuration, the second die 506 separated from the power/ground bumps 502 by the first die 504. The face of the first die 504 is a metal side of the first die 504 and the back of the first die 504 is a bulk silicon side of the first die 504. The face of the second die 506 is a metal side of the second die 506 and the back of the second die 506 is a bulk silicon side of the second die 506.

The first die 504 includes a bulk silicon layer 520 on the back side of the first die 504, a local PDN layer 512 and medium PDN layer 510, and a global PDN layer 508 on the face of the first die 504, an interlayer dielectric 514 on a back side of the first die 504.

The second die 506 includes another global PDN layer 509 on the face of the second die 506, another medium PDN layer 511, another local PDN layer 513, and bulk silicon layer 520 on the back side of the second die 506.

One or more power/ground vias 522 are located between the global PDN layer 508 and the medium PDN layer 510 in the first die 504. One or more power/ground vias 524 are located between the medium PDN layer 510 and the local PDN layer 512 in the first die 504.

One or more power/ground vias 526 are located between the global PDN layer 509 and the medium PDN layer 511 in the second die 506. One or more power/ground vias 528 are located between the medium PDN layer 511 and the local PDN layer 513 in the second die 506.

Several (e.g., hundreds, thousands, etc.) vertical MIVs 530 are disposed in interlayer dielectric 514 of the first die 504. The illustrated vertical MIVs 530 also are located between the global PDN layer 508 in the first die 504 and the global PDN layer 509 in the second die 506. In this configuration, the vertical MIVs 530 couple the face of the first die 504 to the face of the second die 506. Using the vertical MIVs 530 as opposed to TSVs reduces the amount of space that the vias occupy in monolithic 3D-IC 500 as well.

Also in this face-to-face configuration of FIG. 5, power is delivered to both the first die 504 and the second die 506 from the solder bumps 502, through the local PDN layer 512 in the first die 504, the power/ground vias 524 in the first die 504, the medium PDN layer 510 in the first die 504, the power/ground vias 522 in the first die 504, the global PDN layer 508 in the first die 504, the MIVs 530, the global PDN layer 509 in the second die 506, the power/ground vias 526 in the second die 506, the medium PDN layer 511 in the second die 506, the power/ground vias 528 in the second die 506, and the local PDN layer 513 in second die 506.

With this face-to-face configuration, although it works well because power is coupled from the solder bumps 502 to the first die 504 and to the second die 506, there will be a voltage drop in the second die 506 at the global PDN layer 509 in the second die 506, the medium PDN layer 511 in the second die 506, and the local PDN layer 513 in the second die 506. As a result, the performance of any components in the second die 506 may suffer from lack of expected/ideal voltage and/or current.

Figure 6:
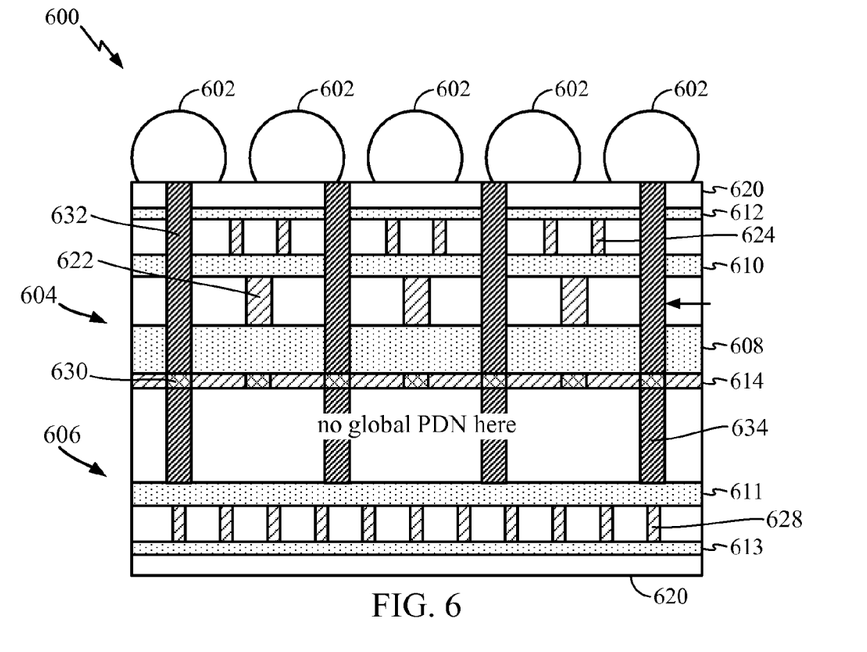
FIG. 6 is a cross-sectional view of a PDN design for a monolithic 3D-IC according to one or more aspects, wherein the 3D-IC 600 is integrated in a face-to-face configuration of a first die and a second die, and the second die includes bypass P/G MIVs.

FIG. 6 is a cross-sectional view of a PDN design for a monolithic 3D-IC 600 according to one or more aspects described herein. The illustrated monolithic 3D-IC 600 includes several solder bumps or power/ground bumps 602 formed adjacent to and in contact with a first die 604, and a second die 606 stacked on the first die 604 in a face-to-back configuration, the second die 606 separated from the power/ground bumps 602 by the first die 604. The face of the first die 604 is a metal side of the first die 604 and the back of the first die 604 is a bulk silicon side of the first die 604. The face of the second die 606 is a metal side of the second die 606 and the back of the second die 606 is a bulk silicon side of the second die 606.

The first die 604 includes a bulk silicon layer 620 on the back side of the first die 604, a local PDN layer 612 and a medium PDN layer 610, and a global PDN layer 608 on the face of the first die 604, an interlayer dielectric 614 on the face of the first die 604.

The second die 606 includes another medium PDN layer 611, another local PDN layer 613, and a bulk silicon layer 620 on the back side of the second die 606.

One or more power/ground vias 622 are located between the global PDN layer 608 and the medium PDN layer 610 in the first die 604. One or more power/ground vias 624 are located between the medium PDN layer 610 and the local PDN layer 612 in the first die 604.

Several vertical MIVs 630 are disposed in the interlayer dielectric 614 of the first die 604. In this face-to-face configuration, the vertical MIVs 630 couple the face of the first die 604 to the face of the second die 606. As previously, using the vertical MIVs 630 as opposed to TSVs reduces the amount of space that the vias occupy.

The second die 606 includes another medium PDN layer 611, another local PDN layer 613, and a bulk silicon layer 620. The second die 606 also includes several power/ground vias 628 located between the medium PDN layer 610 and the local PDN layer 612.

The monolithic 3D-IC 600 differs from the monolithic 3D-IC 500 in that the second die 606 does not have another global PDN layer, such as the global PDN layer 509 of the monolithic 3D-IC 500. The second die 606 also does not have or power/ground vias that would couple such a global PDN to the medium PDN layer 611 in the second die 606.

The monolithic 3D-IC 600 also differs from the monolithic 3D-IC 500 in that the first die 604 includes several bypass power/ground vias 632 (also referred to as the first bypass power/ground vias) in the first die 604 and several bypass power/ground vias 634 (also referred to as the second bypass power/ground vias) in the second die 606. The MIVs 630 couple the bypass power/ground vias 632 and the bypass power/ground vias 634 to each other.

In one implementation, one or more power/ground vias 632 in the first die 604 and one or more bypass power/ground vias 634 in the second die 606 may be coupled together by one or more interconnects which can include copper pads, vertical MIVs 430, etc. In some implementations, the bypass power/ground vias 632 in the first die 604 and the power/ground vias 634 in the second die 606 may be arranged in an array (e.g., 5×5, 10×10, 50×50, etc.) and coupled by corresponding arrays of vertical MIVs 630.

Thus, in the monolithic 3D-IC 600, power is delivered directly to the first die 604 from the power/ground bumps 602. The bypass power/ground vias 632 and 634 (coupled by the vertical MIVs 630) deliver power from the power/ground bumps 602 to the second die 606, bypassing the first die 604. Thus, at least the bypass power/ground vias 632 and 634 couple the power/ground bumps 602 to the medium PDN layer 611 in the second die 606. Additionally it is also noted that, not having a global PDN and power/ground vias in the second die 606 allows space for more components to be fabricated in the monolithic 3D-IC 600.

With the configuration in FIG. 6, because power is delivered from the power/ground bumps 602 to the second die 606 through the bypass power/ground vias 632 and 634 (coupled by the vertical MIVs 630), voltage drop and/or voltage droop in the second die 606 may be reduced. As a result, the performance of any components in the second die 606 may not suffer from lack of ideal voltage and/or current.

Figure 7:
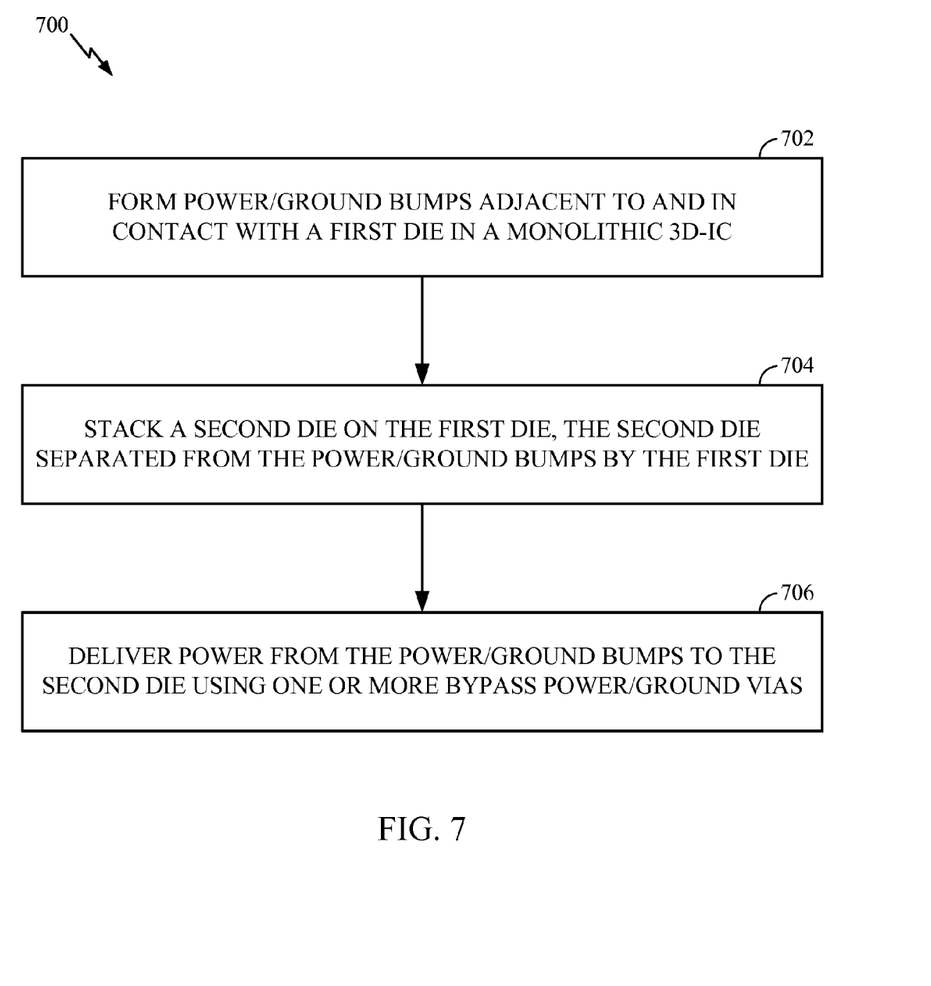
FIG. 7 is a flow chart illustrating a method of fabricating a PDN for a monolithic 3D-IC according to exemplary aspects described herein.

FIG. 7 is a flow chart illustrating a method 700 of designing a PDN for a monolithic 3D-IC according to one or more implementations of the technology described herein. The monolithic 3D-IC may be fabricated in a face-to-face configuration or a face-to-back configuration.

In a block 702, the method 700 includes fabricating a first die (e.g., 404/604) of the monolithic 3D-IC (e.g., 400/600) and forming power/ground bumps (e.g., 402/602) adjacent to and in contact with a first die.

In a block 704, the method 700 includes stacking a second die (e.g., 406/606) on the first die, the second die separated from the power/ground bumps by the first die.

In a block 706, the method 700 includes inserting bypass power/ground vias (e.g., 432, 434/632, 634) in the first and second die to connect the second die to power/ground bumps. In one or more implementations, the method 700 includes delivering power to the second die 406/606 from the power/ground bumps 402/602 using the bypass power/ground vias 432/632, the vertical MIVs 430/630, and the bypass power/ground vias 434/634.

In one or more implementations, the disclosed aspects also include a system which includes a monolithic three-dimensional integrated circuit (3D-IC) (e.g., 400/600). The system includes means for delivering power (e.g., power/ground bumps 402/602) in contact with and adjacent to a first die (e.g., 404/604) of the monolithic 3D-IC. A second die (e.g., 406/606) of the monolithic 3D-IC is stacked on the first die, the second die separated from the means for delivering power by the first die. Means for bypassing dies (e.g., the bypass power/ground vias 432/632, the vertical MIVs 430/630, and the bypass power/ground vias 434/634) are configured to deliver power from the means for delivering power to the second die.

Figure 8:
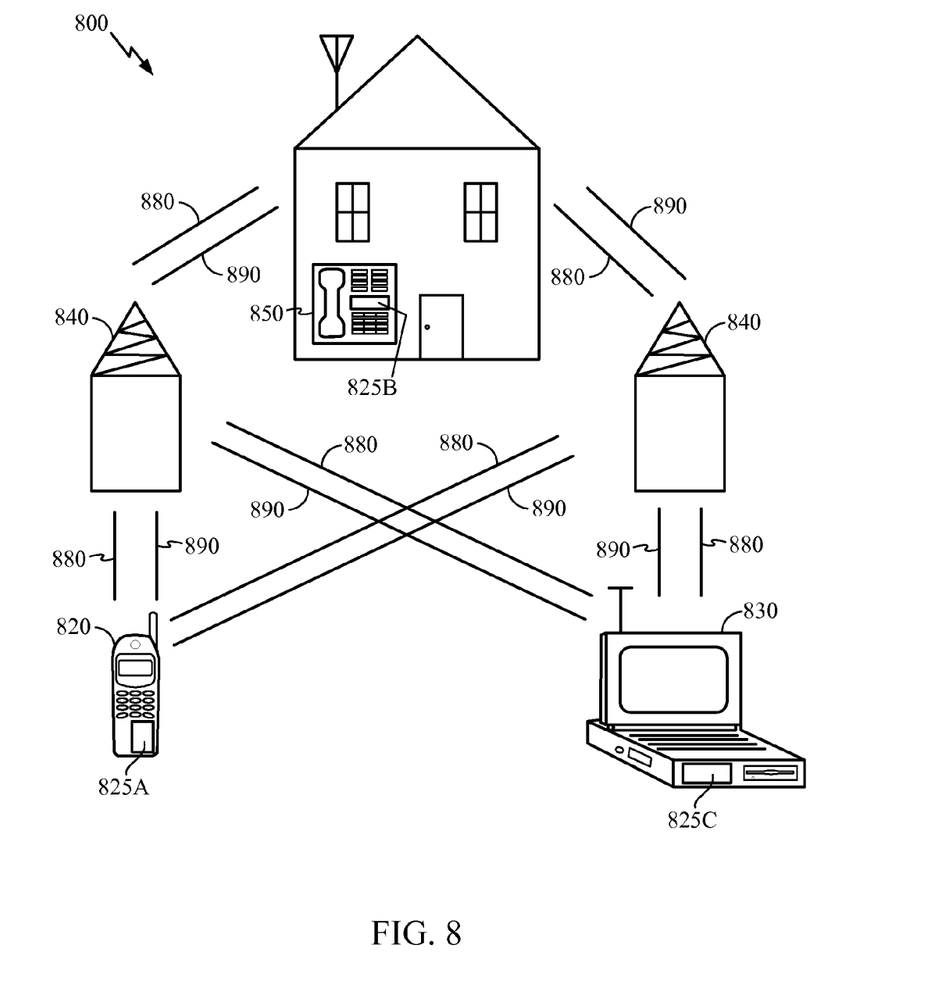
FIG. 8 is a block diagram showing an exemplary wireless communication system in which a monolithic 3D-IC according to exemplary aspects described herein may be employed.

FIG. 8 is a block diagram showing an exemplary wireless communication system in which a PDN design for a monolithic 3D-IC according to one or more implementations of the technology described herein may be employed. FIG. 8 shows three remote units 820, 830, and 850 and two base stations 840. It should be recognized that the depicted wireless communication systems may have additional remote units and/or base stations even though these have not been particularly illustrated or described.

Any of remote units 820, 830, and 850 may include a PDN design for a monolithic 3D-IC such as disclosed herein. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment.

Aspects of the technology described herein and related drawings are directed to specific implementations of the technology. Alternative implementations may be devised without departing from the scope of the technology described herein. Additionally, well-known elements of the technology will not be described in detail or will be omitted so as not to obscure the relevant details.

Although steps and decisions of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the order described above. Furthermore, not every illustrated step and decision may be required in every implementation/variant in accordance with the technology described herein, while some steps and decisions that have not been specifically illustrated may be desirable or necessary in some implementation/variants in accordance with the technology described herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the implementations disclosed herein may be implemented as electronic hardware, computer software, or combinations of both. To show clearly this interchangeability of hardware and software, various illustrative components, blocks, modules, circuits, and steps have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present technology described herein.

The various illustrative logical blocks, modules, and circuits described in connection with the implementation disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the aspects disclosed herein may be implemented directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed implementations is provided to enable any person skilled in the art to make or use the technology described herein. Various modifications to these implementations will be readily apparent to those skilled in the art, and the generic principles defined herein may be applied to other implementations without departing from the spirit or scope of the technology described herein. Thus, aspects of the technology described herein are not intended to be limited to the implementations shown herein, but is to be accorded the widest scope consistent with the principles and novel features disclosed herein.

What is claimed is:

1. An apparatus for delivering power in a monolithic three-dimensional integrated circuit (3D-IC), comprising:
    a first die, with a first side of the first die adjacent to and in contact with power/ground bumps, and a second side of the first die comprising a dielectric layer;
    a second die stacked on the first die, with a third side of the second die in contact with the dielectric layer, and the second die separated from the power/ground bumps by the first die;
    at least a first bypass power/ground via formed in the first die, the first bypass power/ground via in contact with the power/ground bumps; and
    a vertical monolithic inter-tier via (MIV) configured to traverse the dielectric layer and couple the first bypass power/ground via to a power delivery network (PDN) in the second die, a combination of at least the first bypass power/ground via, the MIV, and the PDN in the second die to deliver power from the power/ground bumps to the second die.

2. The apparatus of claim 1, wherein the first side of the first die is a back side of the first die, the second side of the first die is a face of the first die comprising a metal side of the first die, the third side of the second die is a face of the second die comprising a metal side of the second die, wherein second die is stacked on the first die in a face-to-face configuration.

3. The apparatus of claim 2, wherein the first die comprises a global power delivery network (PDN) layer formed on the face of the first die.

4. The apparatus of claim 1, wherein the combination further comprises at least a second bypass power/ground via to couple the MIV to the PDN in the second die.

5. The apparatus of claim 1, wherein the first side of the first die is a face of the first die comprising a metal side of the first die, the second side of the first die is a back side of the first die, the third side of the second die is a face of the second die comprising a metal side of the second die, wherein the second die is stacked on the first die in a face-to-back configuration.

6. The apparatus of claim 5, wherein the first die comprises a global power delivery network (PDN) layer formed on the back side of the first die.

* * * * *